United States Patent
Liu et al.

(10) Patent No.: US 9,627,325 B2
(45) Date of Patent: Apr. 18, 2017

(54) PACKAGE ALIGNMENT STRUCTURE AND METHOD OF FORMING SAME

(71) Applicant: Taiwan Semiconductor Manufacturing Company, Ltd., Hsin-Chu (TW)

(72) Inventors: Ming-Kai Liu, New Taipei (TW); Chia-Chun Miao, Hsin-Chu (TW); Kai-Chiang Wu, Hsin-Chu (TW); Shih-Wei Liang, Dajia Township (TW); Ching-Feng Yang, Taipei (TW); Yen-Ping Wang, Hemei Township (TW); Chun-Lin Lu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/787,630

(22) Filed: Mar. 6, 2013

(65) Prior Publication Data

US 2014/0252657 A1 Sep. 11, 2014

(51) Int. Cl.
*H01L 23/498* (2006.01)
*H01L 21/56* (2006.01)
(Continued)

(52) U.S. Cl.
CPC .......... *H01L 23/544* (2013.01); *H01L 21/565* (2013.01); *H01L 24/81* (2013.01);
(Continued)

(58) Field of Classification Search
CPC ....... H01L 2223/54486; H01L 2224/01; H01L 2224/04105; H01L 2224/12;
(Continued)

(56) References Cited

U.S. PATENT DOCUMENTS 7,982,297 B1 * 7/2011 Heo ...................... H01L 21/565
257/684
8,232,192 B2 * 7/2012 Lin et al. .................. 438/612
(Continued)

FOREIGN PATENT DOCUMENTS

CN 1397092 A 2/2003
CN 102142402 A 8/2011
(Continued)

*Primary Examiner* — Jarrett Stark
*Assistant Examiner* — Bitew Dinke
(74) *Attorney, Agent, or Firm* — Slater Matsil, LLP (57) ABSTRACT

An embodiment is a semiconductor device comprising a first bond pad on a first substrate, the first bond pad having a first center line through a center of the first bond pad and orthogonal to a top surface of the first substrate, and a first conductive connector on a second substrate, the first conductive connector having a second center line through a center of the first conductive connector and orthogonal to a top surface of the second substrate, the second substrate over the first substrate with the top surface of the first substrate facing the top surface of the second substrate. The semiconductor device further comprises a first alignment component adjacent the first bond pad on the first substrate, the first alignment component configured to align the first center line with the second center line.

16 Claims, 8 Drawing Sheets

(51) Int. Cl.
  *H01L 23/00* (2006.01)
  *H01L 23/544* (2006.01)
  *H01L 25/10* (2006.01)
  *H01L 23/31* (2006.01)

(52) U.S. Cl.
  CPC ........ *H01L 25/105* (2013.01); *H01L 23/3128* (2013.01); *H01L 24/13* (2013.01); *H01L 24/16* (2013.01); *H01L 24/73* (2013.01); *H01L 2224/10165* (2013.01); *H01L 2224/16225* (2013.01); *H01L 2224/16227* (2013.01); *H01L 2224/32145* (2013.01); *H01L 2224/32225* (2013.01); *H01L 2224/45144* (2013.01); *H01L 2224/48227* (2013.01); *H01L 2224/73204* (2013.01); *H01L 2224/73265* (2013.01); *H01L 2224/8114* (2013.01); *H01L 2224/81191* (2013.01); *H01L 2225/1023* (2013.01); *H01L 2225/1058* (2013.01); *H01L 2225/1082* (2013.01); *H01L 2924/15331* (2013.01); *H01L 2924/181* (2013.01)

(58) Field of Classification Search
  CPC . H01L 2225/06582; H01L 2924/18301; H01L 23/367; H01L 23/373; H01L 21/48; H01L 21/68; H01L 21/76895; H01L 51/0012; H01L 2021/60067; H01L 24/05; H01L 24/11; H01L 24/10; H01L 24/13; H01L 21/58; H01L 23/488; H01L 23/49816; H01L 25/00; H01L 23/48; H01L 24/01; H01L 24/03; H01L 24/16; H01L 24/81; H01L 24/12; H01L 25/0657; H01L 21/565; H01L 21/56; H01L 24/14; H01L 2224/10165; B29C 39/10
  See application file for complete search history.

(56) References Cited

U.S. PATENT DOCUMENTS

| | | | |
|---|---|---|---|
| 8,253,229 B2 * | 8/2012 | Yamano et al. ............ 257/686 |
| 2001/0010743 A1 | 8/2001 | Cayrefoureq et al. |
| 2004/0169275 A1 * | 9/2004 | Danvir et al. ............ 257/737 |
| 2006/0177965 A1 * | 8/2006 | Senda .................. H01L 21/563 438/108 |
| 2006/0278979 A1 | 12/2006 | Rangel |
| 2007/0235884 A1 * | 10/2007 | Hsu ........................ 257/778 |
| 2009/0057918 A1 * | 3/2009 | Kim ........................ 257/777 |
| 2009/0255705 A1 | 10/2009 | Pratt |
| 2011/0024899 A1 * | 2/2011 | Masumoto et al. ........ 257/737 |
| 2011/0147933 A1 * | 6/2011 | Wu et al. .................... 257/741 |
| 2011/0186899 A1 | 8/2011 | van Lieshout |
| 2011/0237027 A1 * | 9/2011 | Kim et al. .................... 438/107 |
| 2012/0013000 A1 * | 1/2012 | Haba ........................ 257/737 |
| 2012/0032321 A1 * | 2/2012 | West .................. H01L 23/49816 257/737 |
| 2012/0074566 A1 * | 3/2012 | Youn .................. H01L 25/16 257/738 |
| 2012/0205795 A1 * | 8/2012 | Kim et al. .................... 257/737 |
| 2012/0248614 A1 * | 10/2012 | Gandhi et al. ............. 257/762 |
| 2012/0267782 A1 * | 10/2012 | Chen ........................ 257/738 |
| 2012/0306075 A1 * | 12/2012 | Kim et al. .................... 257/738 |
| 2013/0001767 A1 * | 1/2013 | Kajiki ................. H01L 23/3128 257/734 |
| 2013/0113118 A1 * | 5/2013 | Kim et al. .................... 257/782 |
| 2013/0119549 A1 * | 5/2013 | Cheng et al. ............... 257/772 |
| 2013/0128484 A1 * | 5/2013 | Hu et al. .................... 361/770 |
| 2013/0168856 A1 * | 7/2013 | Wang et al. ............... 257/738 |
| 2013/0175705 A1 * | 7/2013 | Lin et al. .................... 257/777 |
| 2013/0187266 A1 * | 7/2013 | Chen ........................ 257/737 |
| 2013/0187288 A1 * | 7/2013 | Hong et al. ............... 257/774 |
| 2013/0228932 A1 * | 9/2013 | Yu et al. .................... 257/774 |
| 2013/0234318 A1 * | 9/2013 | Lee et al. .................... 257/737 |
| 2013/0249074 A1 * | 9/2013 | Lee ........................ 257/713 |
| 2014/0084487 A1 * | 3/2014 | Zhao et al. ............... 257/777 |
| 2015/0069604 A1 * | 3/2015 | Hwang .................. H01L 24/14 257/738 |

FOREIGN PATENT DOCUMENTS

| | | |
|---|---|---|
| JP | 2005311250 A | 11/2005 |
| JP | 2011517114 A | 5/2011 |
| KR | 20120033029 A | 4/2012 |
| KR | 20120135903 | 12/2012 |

* cited by examiner

PACKAGE ALIGNMENT STRUCTURE AND METHOD OF FORMING SAME

BACKGROUND

Electronics can be divided into a simple hierarchy consisting of devices such as integrated circuit (IC) chips, packages, printed circuit boards (PCB), and a system. The package is the interface between an electronic device, such as a computer chip, and a PCB. Devices are made from semiconductor materials such as silicon. Integrated circuits are assembled into a package such as a quad flat pack (QFP), pin grid array (PGA), or ball grid array (BGA), using wire bonding (WB), tape automated bonding (TAB), or flip chip (FC) bumping assembly techniques. The packaged device is then attached either directly to a printed wiring board or to another type of substrate, which is defined as the second level of packaging.

Ball grid array (BGA) packaging technology generally is an advanced semiconductor packaging technology, which is characterized in that a semiconductor chip is mounted on a front surface of a substrate, and a plurality of conductive elements such as solder balls are arranged in a matrix array, customarily referred to as ball grid array, on a back surface of the substrate. The ball grid array allows the semiconductor package to be bonded and electrically connected to an external PCB or other electronic devices. The BGA package may be employed in a memory such as Dynamic Random Access Memory and others.

A basic flip-chip (FC) packaging technology comprises an IC, an interconnect system, and a substrate. A function chip is connected to the substrate with a plurality of solder bumps, wherein the solder bumps form a metallurgical interconnection between the chip and the substrate. The function chip, the solder bump, and the substrate form a flip-chip package. Further, a plurality of balls form a ball grid array (BGA).

Wire bonding can be used to make the electrical connections from chip components such as chip resistors or chip capacitors to a substrate. Two function chips are stacked on top of a plurality of substrate layers. The chips are connected to the substrate by a plurality of bonding gold wires. Other form of wires such as aluminum wire can be used, too. The function chips, the gold wire, and the substrate form a wire bonding (WB) package.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely an alignment and connector shape control component for a package-on-package (POP) structure, a flip-chip structure, a surface mount structure, a three-dimensional integrated circuit (3DIC) package, a two-and-a-half integrated circuit (2.5DIC) package, or the like. Other embodiments may also be applied, however, to other structures in which alignment and connector shape control are important.

Figure 1:
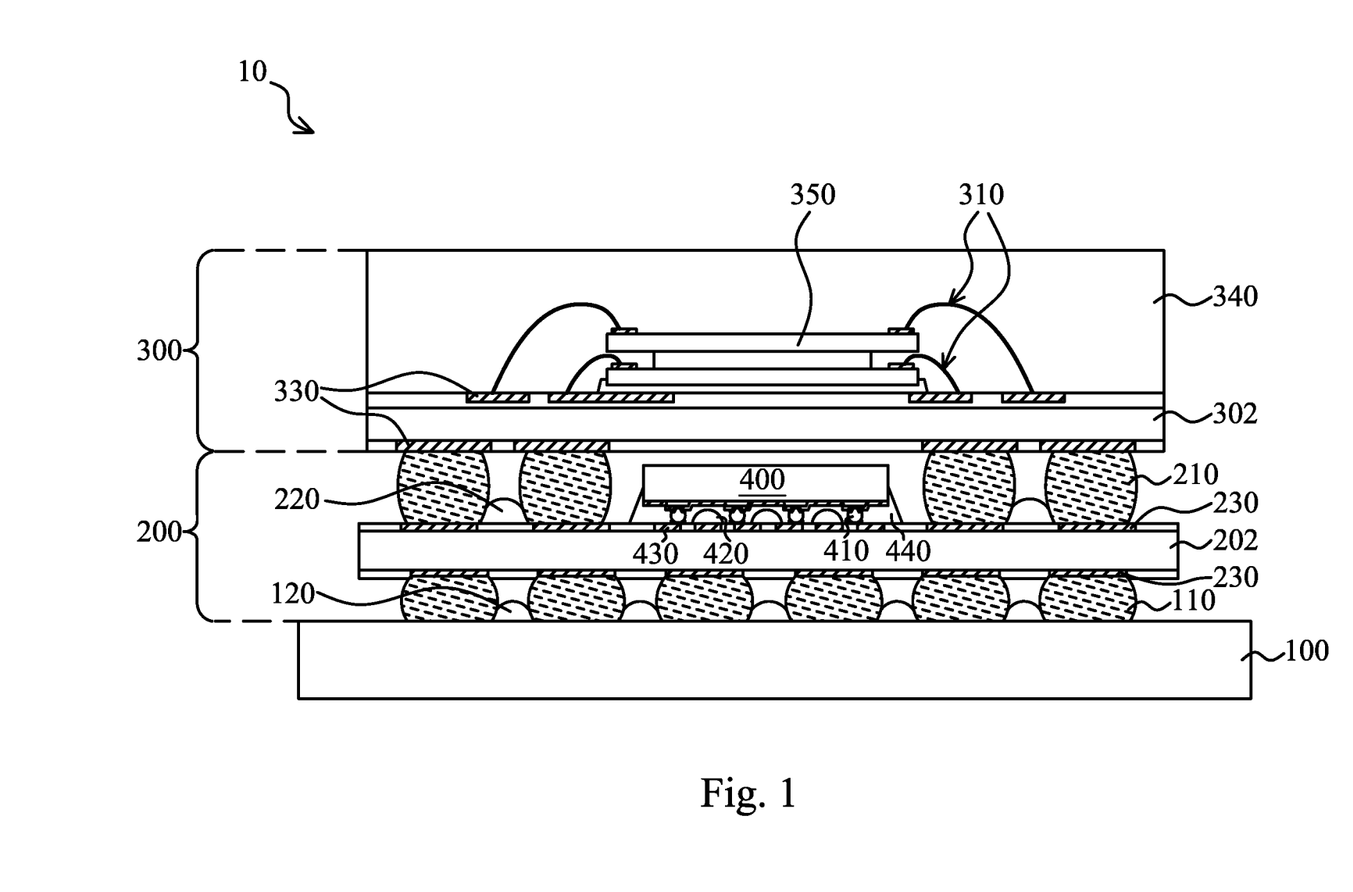
FIG. 1 illustrates a cross-sectional view of a semiconductor device with alignment components according to an embodiment.

With reference now to FIG. 1, there is shown a semiconductor device 10 according to an embodiment. The semiconductor device 10 may include a bottom package 200, a top package 300 attached to the bottom package 200 with a second set of conductive joints 210, and the bottom package 200 attached to a first substrate 100 with a first set of conductive joints 110. In an embodiment, the semiconductor device may have a total thickness from about 0.9 mm to about 1.6 mm.

The top package 300 may comprise one or more stacked dies, such as the dies 350, coupled to a third substrate 302. In the illustrated embodiment, the dies 350 are coupled to the third substrate 302 by wire bonds 310, although other connections may be used, such as contact bumps.

The dies 350 may be encapsulated in a molding compound 340 on a top surface of the third substrate 302. The molding compound 340 may comprise a polymer, a molding underfill, the like, or a combination thereof. The molding compound 340 may be formed by injecting the molding compound 340 to surround the dies 350 and the wire bonds 310. In other embodiments, the top package 300 and the bottom package 200 may be encapsulated in a molding compound on a top surface of the first substrate 100.

The top package 300 may be coupled to the bottom package by a plurality of bond pads 330 on the bottom surface of the third substrate 302, the conductive joints 210, and bond pads 230 on the top surface of the second substrate 202.

The bottom package 200 may comprise one or more dies 400 attached to the top surface and/or bottom surface of the second substrate 202 by conductive connectors 410, a second set of alignment components 220 on the second substrate 202 laterally adjacent the second set of conductive joints 210, a fourth set of alignment components 420 on the second substrate 202 laterally adjacent the conductive connectors 410, and an underfill 440 between the second substrate 202 and the die 400.

The second set of alignment components 220 may be used to align the conductive joints 210 on the top package 300 with the bond pads 230 on the second substrate 202 during the mounting of the top package 300 to the bottom package 200. The alignment components 220 may have a convex or rounded top surface. The alignment components 220 may cause the conductive joints 210 to self-align with the bond pads 230 (see FIGS. 5A and 5B) as discussed further below. The alignment components 220 may comprise a photoresist, an epoxy, a silicone, for example, polydimethylsiloxane (PDMS), or other organic polymer such as polyethylene glycol (PEG), the like, or a combination thereof. The alignment components 220 may be deposited in bulk and shaped by a reflow process, etching, compression molding, the like, or a combination thereof.

The die 400 may comprise an integrated circuit or chip and may be mounted to a top surface and/or bottom surface of the second substrate 202 by way of conductive connectors 410. In the illustrated embodiment, the die 400 may be mounted to the second substrate 202 wherein the conductive connectors 410 are contact bumps that are in contact with bond pads 430 on the second substrate 202, which in turn are electrically connected to the top package 300 and/or the first substrate 100. In another embodiment the die 400 may be mounted to the second substrate 202 using a technique such as surface mounting, to connect the pins of the die 400 to an array of die bond pads on second substrate 202.

The fourth set of alignment components 420 may be used to align the conductive connectors 410 on the die 400 with the bond pads 430 during the mounting of the die 400. The fourth set of alignment components 420 may have a rounded or curved top surface and may be formed of similar materials and processes as the second set of alignment components 220 as described above. Although the second and third set of alignment components 220 and 420 need not be the same materials or formed by the same processes.

The bottom package 200 may be coupled to a first substrate 100 by a plurality of bond pads 230 on the bottom surface of the second substrate 202, the conductive connectors 110, bond pads (not shown) on the top surface of the first substrate 100, and a first set of alignment components 120 on the top surface of the first substrate 100.

The first substrate 100 may have bond pads (not shown) on the top surface of the first substrate 100. In an embodiment, the first substrate 100 may be a silicon substrate, a silicon or glass interposer, a PCB, an organic laminate substrate, or the like. The first substrate 100 may include electronic components and elements formed thereon in some embodiments, or alternatively, the first substrate 100 may be free of electronic components and elements.

The first set of alignment components 120 may be used to align the conductive connectors 110 on second substrate 202 with the bond pads (not shown) on the first substrate 100 during the mounting of the bottom package 200 to the first substrate 100. In another embodiment where there are no bond pads on the first substrate 100 to couple the conductive connectors 110 to, the alignment components 120 may be used to align the bottom package 200 to a specific location on the first substrate 100. The first set of alignment components 120 may have a rounded or curved top surface and may be formed of similar materials and processes as the second set of alignment components 220 as described above. Although the first, second, and third set of alignment components 120, 220, and 420 need not be the same materials or formed by the same processes.

It has been found that embodiments such as those discussed above may reduce the need for tools, jigs, stencils, and the like during the assembly process for a semiconductor device. The self-alignment afforded by the alignment components may reduce the assembly cost and steps need to ensure the components of the semiconductor device are aligned. Further, the alignment components may help to reduce a bridge between conductive connectors during a reflow process as the alignment component may be between the conductive connectors.

Figure 2:
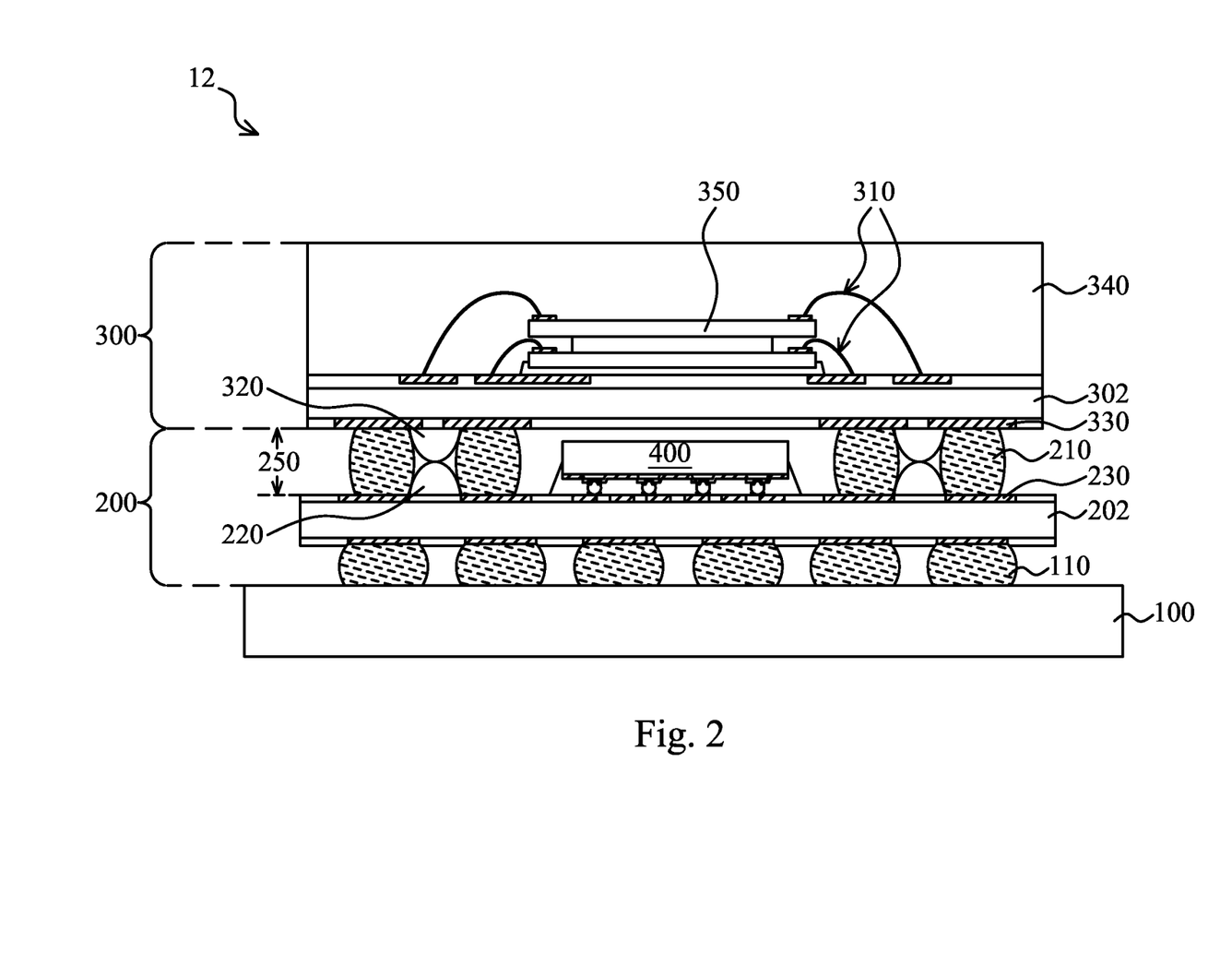
FIG. 2 illustrates a cross-sectional view of another semiconductor device with alignment components according to another embodiment.

FIG. 2 illustrates a semiconductor device 12 according to another embodiment. In this embodiment, the semiconductor device 12 includes the second set of alignment components 220 on a top surface of the second substrate 202 and a third set of alignment components 320 on a bottom surface of the third substrate 302, wherein the alignment components 320 are over and contacting the alignment components 220. Although not shown in FIG. 2, this embodiment may also include the first set of alignment components 120 and the fourth set of alignment components 420 (see FIG. 1). The height 250 between the second substrate 202 and the third substrate 302 may be precisely controlled by the height of the second set of alignment components 220 and the third set of alignment components 320. In an embodiment, the height 250 may be substantially equal to the height at an apex of the second set of alignment components 220 plus the height at an apex of the third set of alignment components 320.

The alignment components 220 and 320 may have a rounded or curved top surface and may be formed of similar materials and processes as the second set of alignment components 220 as described above. Although the first, second, and third set of alignment components 120, 220, and 320 need not be the same materials or formed by the same processes.

By having alignment components on a top surface of a bottom package and also on a bottom surface of a top package, the gap (see height 250) between the packages may be better controlled and the reliability of the shape of the conductive connector between the packages may be improved.

Figure 3:
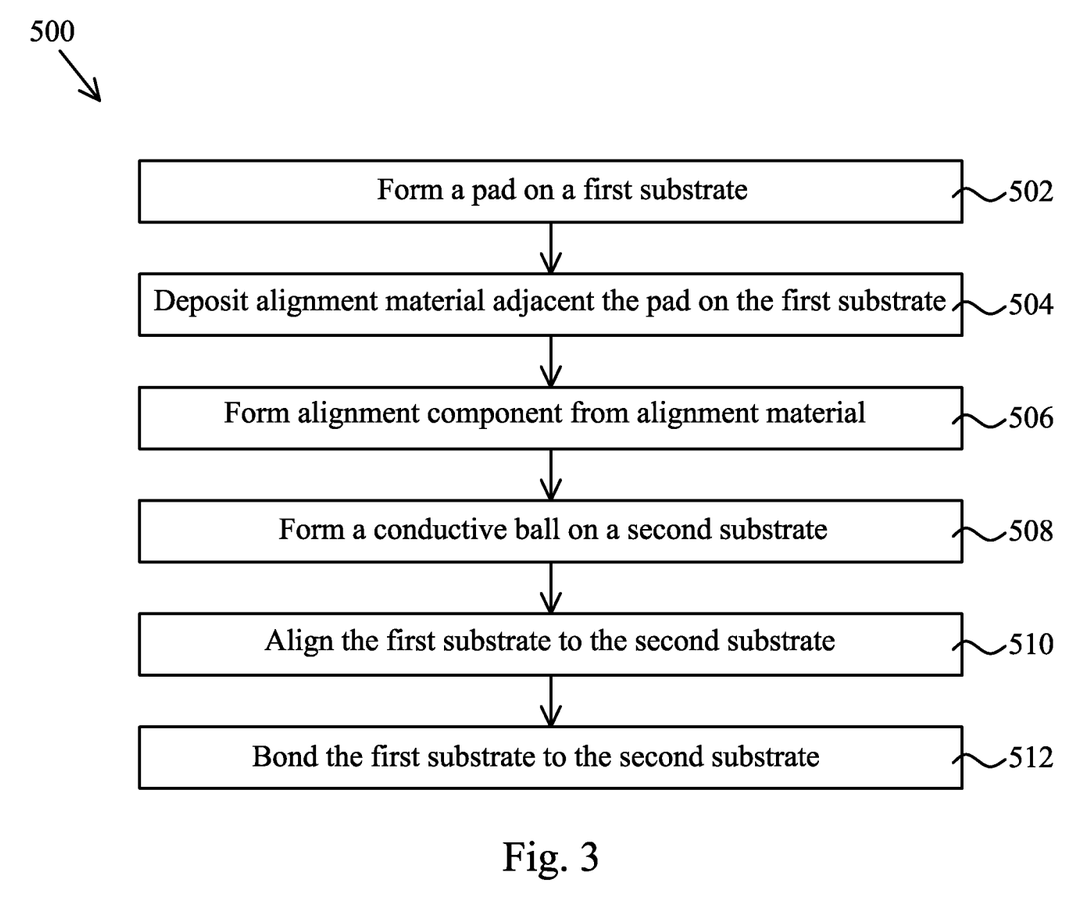
FIG. 3 illustrates a flow diagram of a method for manufacturing a semiconductor device with an alignment component to an embodiment.

FIG. 3 illustrates a flow diagram of a method 500 for manufacturing a semiconductor device in accordance with an embodiment. While method 500 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 502, a bond pad 22 is formed on a first substrate 20. Step 502 is illustrated in FIG. 4A as described below.

Figure 4A:
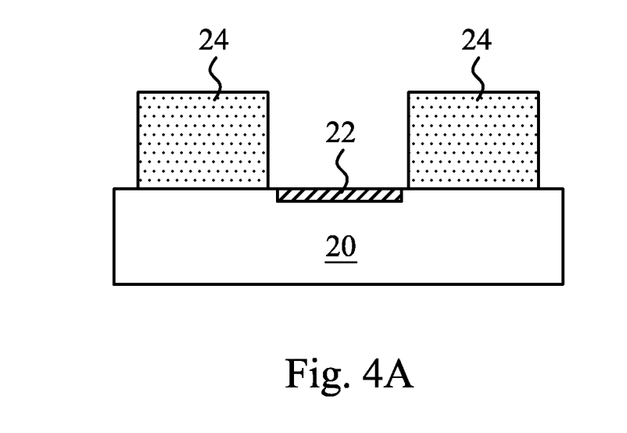
FIGS. 4A and 4B illustrate intermediate stages of forming an alignment component according to an embodiment.

With reference now to FIG. 4A, there is shown a first substrate 20 with a bond pad 22 on a top surface of the first substrate 20, and alignment components 26 adjacent the bond pad 22 and on the top surface of the first substrate 20. In an embodiment, the first substrate 20 may be a silicon substrate, a silicon or glass interposer, a printed circuit board (PCB), an organic laminate substrate, or the like. The first substrate 20 may include electronic components and elements formed thereon in some embodiments, or alternatively, the first substrate 20 may be free of electronic components and elements.

The first substrate 20 may include metallization layers (not shown). The metallization layers may comprise through substrate vias (TSVs) to connect devices and components, e.g., dies, chips, packages, or the like, above and below the first substrate 20 to form functional circuitry. The metallization layers may be formed of alternating layers of dielectric (e.g., low-k dielectric material) and conductive material (e.g., copper) and may be formed through any suitable process (such as deposition, damascene, dual damascene, etc.). The metallization and dielectric layers may include metal lines and vias to electrically couple the devices and components. Only a portion of the first substrate 20 is illustrated in the figures, as this is sufficient to fully describe the illustrative embodiments.

The bond pads 22 may comprise a conductive material such as aluminum, copper, gold, nickel, the like, or a combination thereof. In some embodiments, an organic solderability preservative (OSP) may be applied to the bond pads 22. In other embodiments, the bond pads 22 may be formed using an electroless nickel-electroless palladium-immersion gold technique (ENEPIG).

At step 504, alignment material 24 may be deposited and patterned on the top surface of the first substrate. Step 504 is illustrated in FIG. 4A as described below.

The alignment material 24 may comprise a photoresist, an epoxy, a silicone, for example, PDMS, or other organic polymer such as PEG, the like, or a combination thereof. The alignment material 24 may be deposited in bulk or other suitable methods. The alignment material 24 may be patterned to be adjacent the bond pad 22 by etching or other suitable methods. In an embodiment, the alignment material 24 may have a top surface that is substantially parallel to a major surface of the first substrate 20.

Figure 4B:
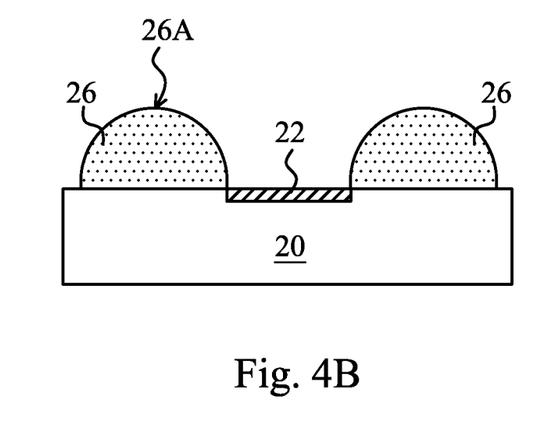

At step 506, alignment components 26 are formed from the alignment material 24. Step 506 is illustrated in FIG. 4B as described below.

The alignments components 26 may be shaped to have rounded or curved top surfaces. In an embodiment, the alignment components 26 may be shaped by performing a reflow process on the alignment material at a temperature from about 160° C. to about 200° C. for about 8 min. to about 12 min. In another embodiment, the alignment components 26 may be shaped by etching, molding (see FIGS. 7A through 7C discussed below), or other suitable methods. The convex top surfaces 26A of the alignment components 26 may guide the conductive connectors 32 (see FIGS. 5A and 5B) in a direction toward the bond pads 22 as discussed below). An edge of the alignment component 26 may be aligned with an edge of the bond pad 22, the alignment component 26 may partially overlap the bond pad 22, or the alignment component 26 may be laterally spaced from the bond pad 22.

At step 508, conductive connectors 32 are formed on a second substrate 30. At step 510, the first substrate 20 and the second substrate 30 are aligned. Steps 508 and 510 are illustrated in FIG. 5A as described below.

Figures 5A, 5B:
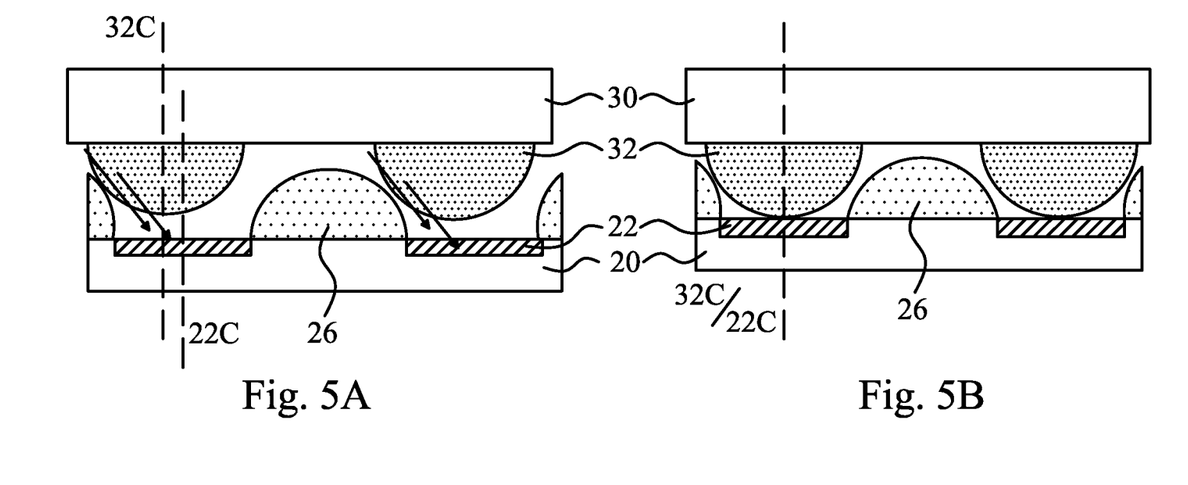
FIGS. 5A and 5B illustrate intermediate stages of forming a semiconductor device using an alignment component according to an embodiment.
Figure 5C:
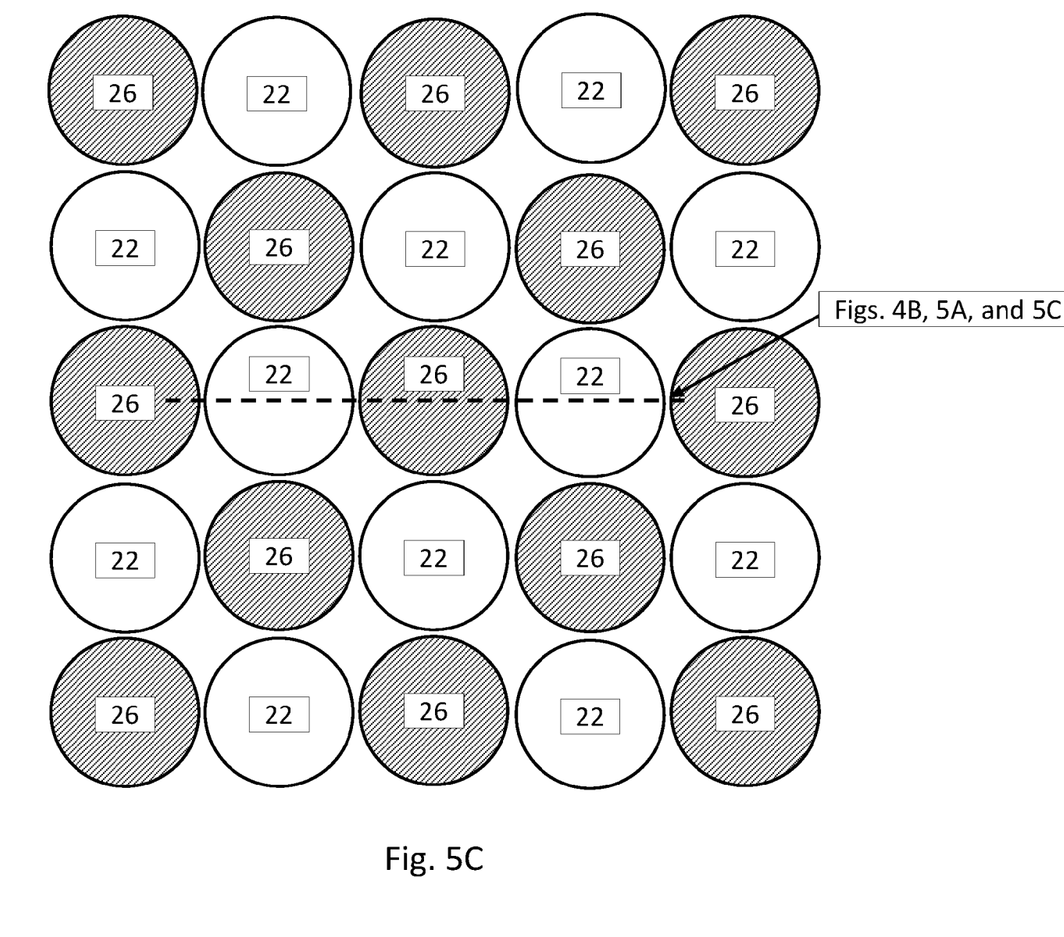
FIG. 5C illustrates a plan view of an intermediate stage of a semiconductor device using alignment components according to an embodiment.

FIG. 5A illustrates the first substrate 20 having two bond pads 22 with three alignment components 26 adjacent the bond pads 22. One of the alignment components 26 is between the bond pads 22 while the other two alignment components are adjacent the outer edges of the bond pads 22. Each conductive connector 32 having a center line 32C orthogonal to a top surface of the second substrate 30 and through a center of the conductive connector 32 and each bond pad 22 having a center line 22C orthogonal to a top surface of the first substrate 20 and through a center of the bond pad 22. The conductive connectors 32 may be solder balls, microbumps, controlled collapse chip connection (C4) bumps, or the like and may comprise a material such as tin, silver, lead-free tin, copper, the like, or a combination thereof.

After the conductive connectors 32 are formed on the second substrate, the second substrate 30 may be aligned with the first substrate 20 to allow the substrates to be bonded together. In an embodiment, the second substrate 30 may be lowered towards the first substrate 20 until the conductive connectors 32 contact the alignment components 26. The convex top surface of the alignment component 26 and the convex top surface of the conductive connector 32 allow the center line 32C of the conductive connector 32 to self-align towards the center line 22C of the bond pad 22 as illustrated in FIG. 5B.

At step 512, the first substrate 20 is bonded to the second substrate 30. Step 512 is illustrated in FIG. 5B as described below.

FIG. 5B illustrates the conductive connectors 32 after they have been aligned with the bond pads 22. The conductive connectors 32 may then be bonded to the bond pads 22 through, for example, a reflow process. The bonding will electrically and physically couple the conductive connectors 32 with the bond pads 22. Although FIGS. 4A through 5B illustrate an alignment component 26 on two sides of each bond pad 22, there may be more alignment components 26 adjacent each bond pad 22, for example in a checkerboard pattern, wherein each bond pad 22 may be surrounded by four alignment components 26 on four sides of the bond pad 22 (see, e.g., FIG. 5C). In some embodiments, the four alignment components 26 on four sides of the bond pads 22 have the same structure. In some embodiments, as illustrated in FIG. 2, there may be alignment components on both the first substrate 20 and the second substrate 30.

Figure 6:
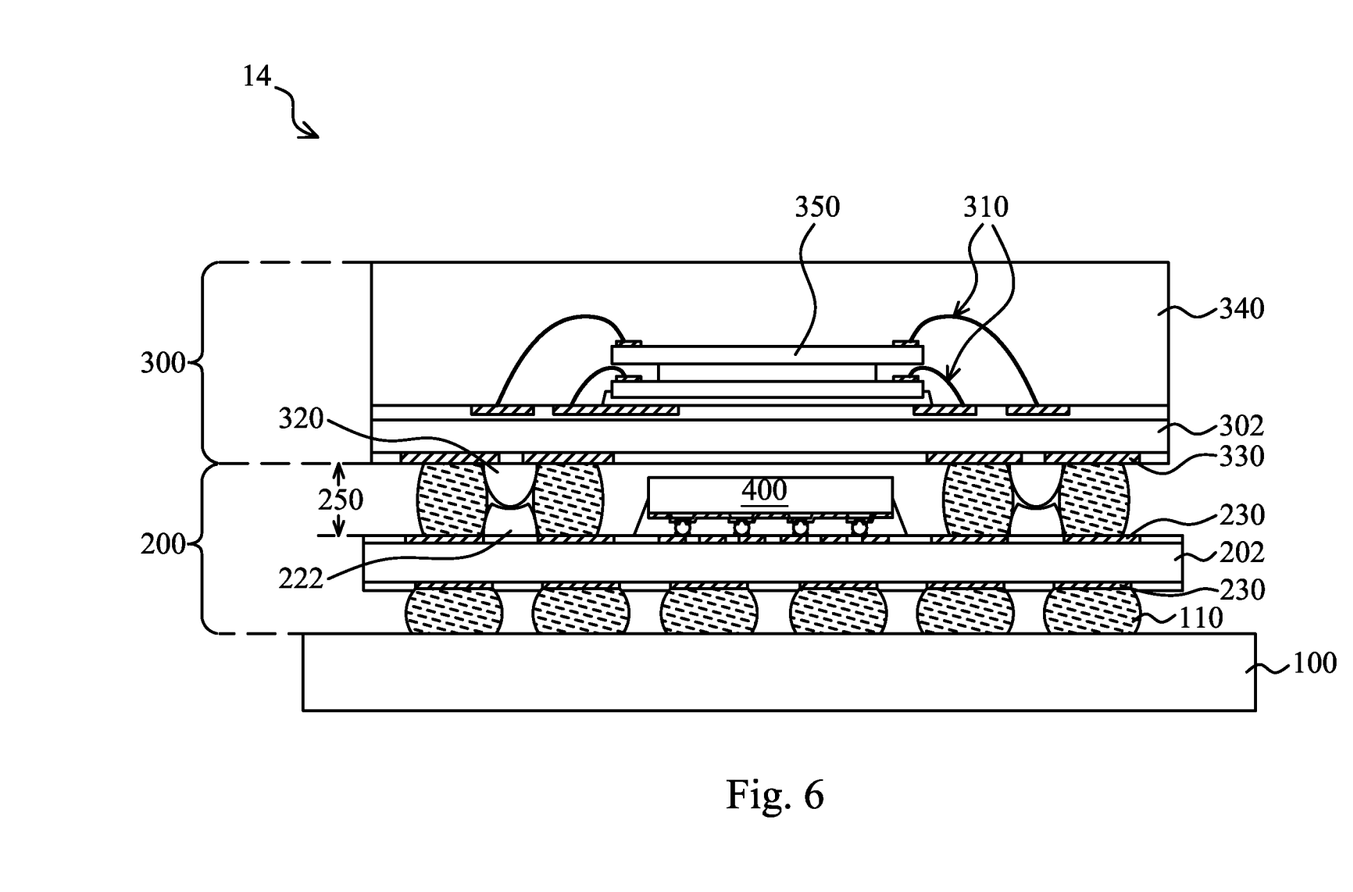
FIG. 6 illustrates a cross-sectional view of another semiconductor device with alignment components according to another embodiment.

FIG. 6 illustrates a semiconductor device 14 according to another embodiment. In this embodiment, the semiconductor device 14 includes a second set of concave alignment components 222 on a top surface of the second substrate 202 and the third set of alignment components 320 on a bottom surface of the third substrate 302, wherein the alignment components 320 have a convex or rounded shape and are over and contacting the concave alignment components 222. Although not shown in FIG. 6, this embodiment may also include the first set of alignment components 120 and the fourth set of alignment components 420 (see FIG. 1). The height 250 between the second substrate 202 and the third substrate 302 may be precisely controlled by the height of the second set of concave alignment components 222 and the third set of alignment components 320. In an embodiment, the height 250 may be substantially equal to the height at a nadir of the concave surface of the second set of concave alignment components 222 plus the height at an apex of the third set of alignment components 320.

By having concave alignment components on a top surface of a bottom package and convex or rounded alignment components on a bottom surface of a top package, the gap (see height 250) between the packages may be controlled and the top and bottom packages may also be self-aligned. The self-alignment afforded by this embodiment may reduce the assembly cost and steps need to ensure the components of the semiconductor device are aligned while also allowing for more control and potentially a larger height 250 between the top and bottom packages. Further, the alignment components may help to reduce a bridge between conductive connectors during a reflow process as the alignment component is between the conductive connectors.

Figure 7A:
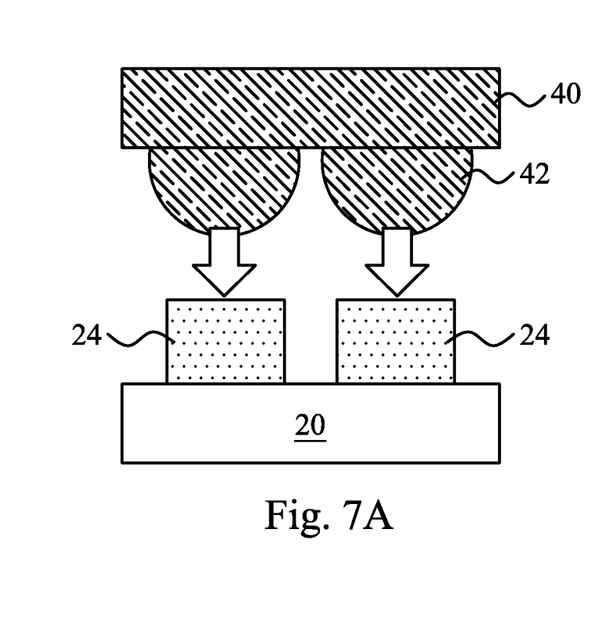
FIGS. 7A through 7C illustrate intermediate stages of forming an alignment component according to another embodiment.
Figure 7B:
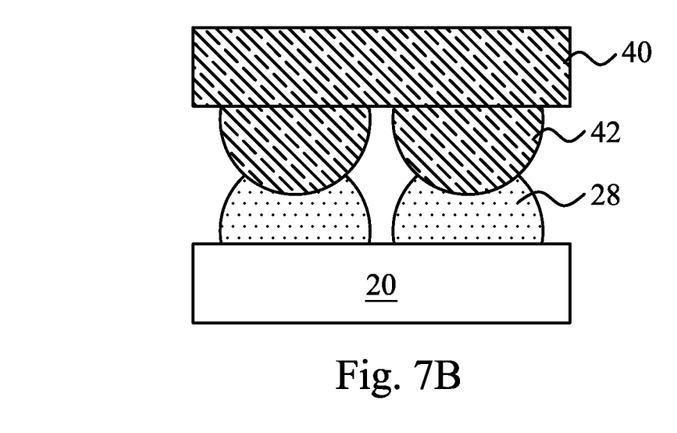
Figure 7C:
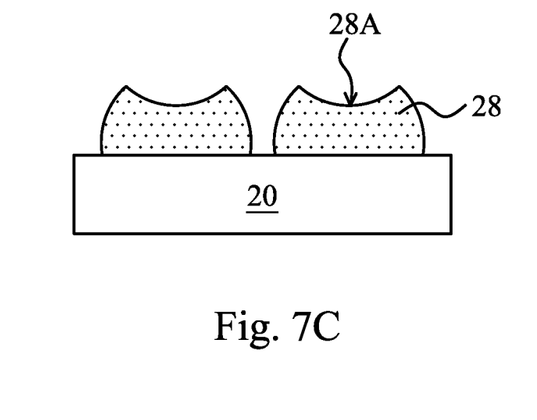

FIGS. 7A through 7C illustrate a method of forming concave alignment components according to an embodiment. The first substrate 20 and alignment material 24 has been previously described in reference to FIG. 4A, and thus will not be repeated herein. The first substrate 20 may further include one or more bond pads adjacent the alignment material 24 (see FIG. 4A). A molding base 40 with molding forms 42 is over the first substrate 20 and the alignment material 24. The molding base 40 and the molding forms 42 may comprise a metal or any material suitable for the pressure and temperature of the molding process. In an embodiment, the molding forms 42 may have convex or rounded surfaces as shown in FIG. 7A. In another embodiment, the molding forms 42 may have surfaces that are triangular, square, other polygonal shapes, or the like.

FIG. 7B illustrates the molding process to form concave alignment components 28. The alignments material 24 may be shaped to have concave top surfaces. In an embodiment, the alignment material 24 may be shaped by performing a reflow process on the alignment material 24 while the molding forms 42 are lowered to contact and shape the alignment material 24. The convex surfaces of the molding forms 42 are transferred to the top surface of the alignment components 28 to cause the alignment components 28 to have concave top surfaces 28A. The reflow process may be performed at a temperature from about 160° C. to about 200° C. for about 8 min. to about 12 min. In another embodiment, the concave alignment components 28 may be shaped by etching, or other suitable methods. The concave top surfaces 28A of the alignment components 28 may guide the alignment components 44 (see FIGS. 8A and 8B) in a direction toward the center of the concave alignment components 28 as discussed below. An edge of the concave alignment component 28 may be aligned with an edge of the adjacent bond pad (not shown), the concave alignment component 28 may partially overlap the adjacent bond pad, or the concave alignment component 28 may be laterally spaced from the adjacent bond pad.

FIG. 7C illustrates the concave alignment components 28 after the molding forms 42 have been removed. The top surfaces of the concave alignment components 28 have concave top surfaces as transferred from the rounded surface of the molding forms 42.

Figure 8A:
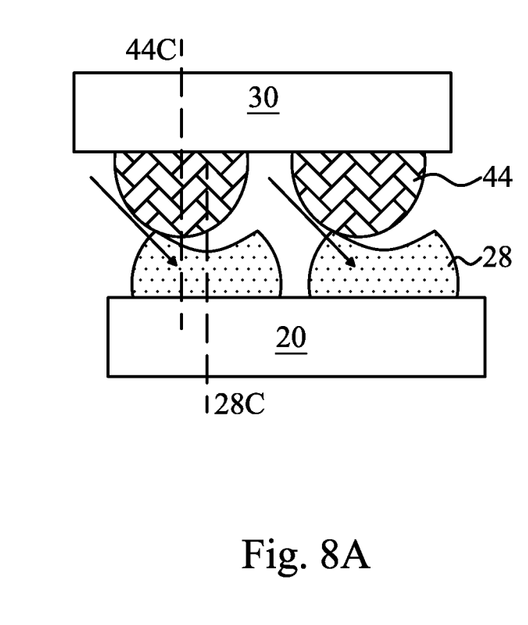
FIGS. 8A and 8B illustrate intermediate stages of forming a semiconductor device using an alignment component according to another embodiment.
Figure 8B:
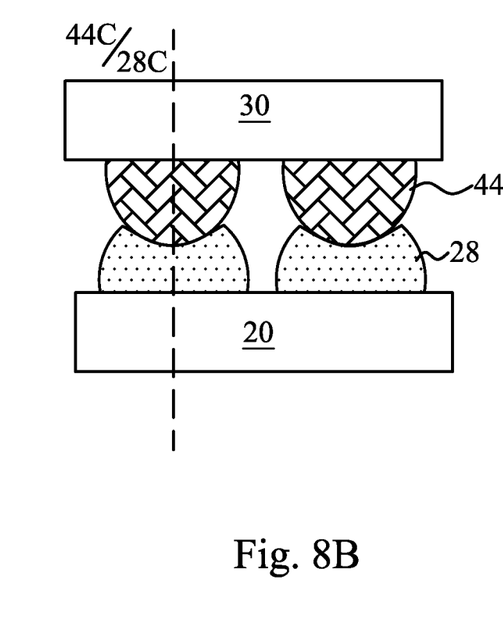

FIGS. 8A and 8B illustrate the alignment of the first substrate 20 with the second substrate 30. In this embodiment, a center line 44C of convex alignment components 44 on the second substrate 30 are substantially aligned with a center 28C of the concave alignment components 28 on the first substrate (see FIG. 8B). The alignment of the second substrate 30 with the first substrate 20 may allow the substrates to be bonded together. In an embodiment, the second substrate 30 may be lowered towards the first substrate 20 until the convex alignment components 44 contact the concave alignment components 28. The convex top surface of the convex alignment components 44 and the concave top surface of the concave alignment components 28 allow the center 44C of the convex alignment components 44 to self-align towards the center of the concave alignment components 28C. In an embodiment, an apex of the convex top surface of the convex alignment component 44 is aligned with and contacting a nadir of the concave top surface of the concave alignment component 28. By having the alignment components 44 and 28 self-align, connectors and bond pads on the first and second substrates 20 and 30 may also be self-aligned, e.g., conductive joints 210 and bond pads 230 of FIG. 6.

An embodiment is a semiconductor device comprising a first bond pad on a first substrate, the first bond pad having a first center line through a center of the first bond pad and orthogonal to a top surface of the first substrate, and a first conductive connector on a second substrate, the first conductive connector having a second center line through a center of the first conductive connector and orthogonal to a top surface of the second substrate, the second substrate over the first substrate with the top surface of the first substrate facing the top surface of the second substrate. The semiconductor device further comprises a first alignment component adjacent the first bond pad on the first substrate, the first alignment component configured to align the first center line with the second center line.

Another embodiment is a semiconductor device comprising a first set of bond pads on a first side of a first substrate, a first set of conductive connectors on a first side of a second substrate, the first side of the second substrate facing the first side of the first substrate, the first set of conductive connectors coupled to the first set of bond pads, and a first set of alignment components on the first side of the first substrate, each of the first set of alignment components being adjacent at least one of the first set of bond pads, the first set of alignment components being configured to align the first set of conductive connectors to the first set of bond pads. The semiconductor device further comprises a second set of conductive connectors on a second side of the first substrate, the second side being opposite the first side of the first substrate, and a second set of alignment components being on a first side of a third substrate, the first side of the third substrate facing the second side of the first substrate, each of the second set of alignment components being adjacent at least one of the second set of conductive connectors, the second set of alignment components configured to align the second set of conductive connectors to the third substrate.

Yet another embodiment is a method of forming a semiconductor device, the method comprising forming a first bond pad on a first substrate, forming a first conductive connector on a second substrate, and forming a first alignment component on the first substrate, the first alignment component adjacent the first bond pad. The method further comprises aligning the first substrate to the second substrate with the alignment component, the alignment component aligning the first conductive connector to the first bond pad, and bonding the first substrate to the second substrate, the first bond pad being bonded to the first conductive connector.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   a first bond pad on a first substrate;
   a first conductive connector coupling the first bond pad of the first substrate to a second substrate the second substrate being over the first substrate with a top surface of the first substrate facing a top surface of the second substrate;
   a first alignment component adjacent the first bond pad on the top surface of the first substrate, the first alignment component having a rounded, convex top surface, the first alignment component configured to align the first bond pad with the first conductive connector, rounded portions of the rounded, convex top surface of the first alignment component directly adjoining the top surface of the first substrate, the rounded, convex top a surface of the first alignment component contacting a sidewall of the first conductive connector;
   a second alignment component adjacent a second side of the first bond pad on the top surface of the first substrate, the second alignment component having a rounded, convex top surface, the first alignment component being adjacent a first side of the first bond pad;
   a third alignment component adjacent a third side of the first bond pad on the top surface of the first substrate, the third alignment component having a rounded, convex top surface;
   a fourth alignment component adjacent a fourth side of the first bond pad on the top surface of the first substrate, the fourth alignment component having a rounded, convex top surface, the first, second, third, and fourth sides being different sides of the first bond pad, and each of the first, second, third, and fourth alignment components being physically separated from each other, the first, second, third, and fourth alignment components being a part of a first set of alignment components;
   a second set of alignment components having rounded, convex top surfaces on the top surface of the first substrate, each of the second set of alignment components being smaller than each of the first set of alignment components;
   a die mounted to the top surface of the first substrate with a second set of conductive connectors, each of the second set of alignment components being adjacent at least one of the second set of conductive connectors; and
   a fifth alignment component on the second substrate, the fifth alignment component over and contacting the first alignment component, the fifth alignment component having a rounded, convex top surface, wherein an apex of the rounded, convex top surface of the fifth alignment component contacts an apex of the rounded, convex top surface of the first alignment component.

2. The semiconductor device of claim 1, wherein the first alignment component comprises a material selected from the group consisting of a photoresist, an epoxy, polydimethylsiloxane, an organic polymer, and polyethylene glycol.

3. The semiconductor device of claim 1 further comprising:
   a second bond pad on the first substrate, the second bond pad adjacent the first alignment component, the first alignment component being laterally between the first bond pad and the second bond pad; and
   a second conductive connector coupling the second bond pad of the first substrate to the second substrate, the first alignment component being further configured to align the second bond pad with the second conductive connector, the rounded, convex top surface of the first alignment component contacting a sidewall of the second conductive connector.

4. The semiconductor device of claim 3, wherein the first alignment component is laterally between the first conductive connector and the second conductive connector.

5. The semiconductor device of claim 1, wherein the first and fifth alignment components are configured to control a distance between the top surfaces of the first substrate and the second substrate.

6. The semiconductor device of claim 3, wherein the rounded, convex top surface of the first alignment component extending from the sidewall of the first conductive connector to the sidewall of the second conductive connector.

7. The semiconductor device of claim 1, wherein the rounded, convex top surfaces of the second set of alignment components are configured to align the second set of conductive connectors of the die.

8. A semiconductor device comprising:
   a first set of bond pads on a first side of a first substrate;
   a first set of conductive connectors on a first side of a second substrate, the first side of the second substrate facing the first side of the first substrate, the first set of conductive connectors coupled to the first set of bond pads;
   a first set of alignment components on the first side of the first substrate, each of the first set of alignment components being adjacent at least one of the first set of bond pads, the first set of alignment components being configured to align the first set of conductive connectors to the first set of bond pads, at least one of the first set of bond pads having four of the first set of alignment components surrounding the at least one of the first set of bond pads, each of the four alignment components being physically separated from each other and on a different side of the at least one of the first set of bond pads;
   a second set of conductive connectors on a second side of the first substrate, the second side being opposite the first side of the first substrate;
   a second set of alignment components being on a first side of a third substrate, the first side of the third substrate facing the second side of the first substrate, each of the second set of alignment components being adjacent at least one of the second set of conductive connectors, the second set of alignment components configured to align the second set of conductive connectors to the third substrate;
   a third set of alignment components having round top surfaces on the first side of the first substrate, each of the third set of alignment components being smaller than each of the first set of alignment components;

a die mounted to the first side of the first substrate with a third set of conductive connectors, each of the third set of alignment components being adjacent at least one of the third set of conductive connectors, the third set of alignment components configured to align the third set of conductive connectors to the first substrate; and a fourth set of alignment components on the first side of the second substrate, each of the fourth set of alignment components being over and contacting one of the first set of alignment components, each of the fourth set of alignment components having a convex top surface and each of the first set of alignment components having a concave top surface.

9. The semiconductor device of claim 8, wherein each of the second set of alignment components have convex top surfaces.

10. The semiconductor device of claim 8, wherein at least one of the first set of alignment components contacts a sidewall of at least one of the first set of conductive connectors.

11. The semiconductor device of claim 8, wherein an entire top surface of at least one of the first set of alignment components is a rounded, convex top surface.

12. A semiconductor device comprising:
a first bond pad on a first surface of a first substrate;
a conductive connector on a second surface of a second substrate, the conductive connector contacting the first bond pad, the second substrate over the first substrate with the first surface of the first substrate facing the second surface of the second substrate;
a first alignment component adjacent the first bond pad on the first surface of the first substrate, the first alignment component having a top surface, the entire top surface of the first alignment component being a rounded, convex top surface, the rounded, convex top surface having a first end directly adjoining the first surface of the first substrate and a second end directly adjoining the first surface of the first substrate, the rounded, convex top surface of the first alignment component contacting a sidewall of the conductive connector; and
a second alignment component adjacent the conductive connector on the second surface of the second substrate, the second alignment component having a convex top surface, an apex of the convex top surface of the second alignment component contacting an apex of the convex top surface of the first alignment component.

13. The semiconductor device of claim 12 further comprising:
a die mounted to the first surface of the first substrate with a first set of conductive connectors; and
a third alignment component adjacent at least two of the first set of conductive connectors and between the die and the first substrate, the third alignment component having a rounded, convex top surface.

14. The semiconductor device of claim 13 further comprising an underfill material between the die and the first substrate, the underfill material surrounding the third alignment component and the first set of conductive connectors.

15. The semiconductor device of claim 12, wherein the rounded, convex top surface of the first alignment component is configured to, during alignment of the conductive connector to the first bond pad, contact a top surface of the conductive connector to direct the conductive connector towards alignment with the first bond pad.

16. The semiconductor device of claim 13, wherein the third alignment component is smaller than the first alignment component.

* * * * *